United States Patent
Kurosaka et al.

(10) Patent No.: US 12,040,760 B2
(45) Date of Patent: Jul. 16, 2024

(54) AUDIO DEVICE AND AUDIO SIGNAL PROCESSING METHOD

(71) Applicant: YAMAHA CORPORATION, Hamamatsu (JP)

(72) Inventors: Yuumi Kurosaka, Hamamatsu (JP); Katsumasa Kosuge, Hamamatsu (JP); Takanori Shimizu, Hamamatsu (JP)

(73) Assignee: YAMAHA CORPORATION, Hamamatsu (JP)

(*) Notice: Subject to any disclaimer, the term of this patent is extended or adjusted under 35 U.S.C. 154(b) by 612 days.

(21) Appl. No.: 17/201,745

(22) Filed: Mar. 15, 2021

(65) Prior Publication Data
US 2021/0305959 A1    Sep. 30, 2021

(30) Foreign Application Priority Data

Mar. 25, 2020    (JP) ................................. 2020-053921

(51) Int. Cl.
H03G 3/30    (2006.01)
H04R 29/00    (2006.01)

(52) U.S. Cl.
CPC .......... *H03G 3/3005* (2013.01); *H04R 29/001* (2013.01)

(58) Field of Classification Search
CPC ............................ H03G 3/3005; H04R 29/001
See application file for complete search history.

(56) References Cited

U.S. PATENT DOCUMENTS

| | | | |
|---|---|---|---|
| 9,632,749 B2 | 4/2017 | Mizobuchi | |
| 10,285,081 B1 | 5/2019 | Bartels | |
| 2003/0030412 A1 | 2/2003 | Matsuda | |
| 2004/0151336 A1 | 8/2004 | Han | |
| 2010/0322438 A1 | 12/2010 | Siotis | |
| 2013/0251163 A1* | 9/2013 | Adamson | H04R 29/007 381/58 |

(Continued)

FOREIGN PATENT DOCUMENTS

| | | |
|---|---|---|
| CN | 102917294 A | 2/2013 |
| CN | 104811154 A | 7/2015 |
| EP | 2908209 A1 | 8/2015 |

(Continued)

OTHER PUBLICATIONS

Office Action issued in Japanese Appln. No. 2020-053921, mailed on Aug. 22, 2023. English machine translation provided.

(Continued)

*Primary Examiner* — Andrew L Sniezek
(74) *Attorney, Agent, or Firm* — ROSSI, KIMMS & McDOWELL LLP

(57) ABSTRACT

An audio device including: an audio signal input section that receives an audio signal; a signal processor that performs signal processing on the audio signal; an amplifier that amplifies the audio signal; an audio signal output section that outputs the amplified audio signal; a feeder that feeds electric power to an external device; a feed detector that detects a state of feeding of the electric power by the feeder; a controller that causes the signal processor to perform level limiting processing to limit a level of the audio signal in a case where the feed detector detects that the feeder is feeding the electric power to the external device.

20 Claims, 7 Drawing Sheets

(56) References Cited

U.S. PATENT DOCUMENTS

2016/0360315 A1    12/2016    Matsuyama

FOREIGN PATENT DOCUMENTS

| JP | 2003152484 A | 5/2003 |
| JP | 2004021162 A | 1/2004 |
| JP | 2016225913 A | 12/2016 |

OTHER PUBLICATIONS

Office Action issued in European Appln. No. 21163232.8 mailed on Sep. 21, 2022.
Office Action issued in Chinese Appln. No. 202110311950.6 mailed on Jul. 20, 2022. English machine translation provided.
Extended European Search Report issued in European Appln. No. 21163232.8 mailed on Aug. 18, 2021.

* cited by examiner

AUDIO DEVICE AND AUDIO SIGNAL PROCESSING METHOD

CROSS REFERENCE TO RELATED APPLICATIONS

This Nonprovisional application claims priority under 35 U.S.C. § 119(a) on Patent Application No. 2020-053921 filed in Japan on Mar. 25, 2020 the entire contents of which are hereby incorporated by reference.

BACKGROUND

Technical Field

The present disclosure relates to an audio signal processing method.

Background Information

There exists an audio device that monitors the voltage of the power-supply line of a battery connected to the audio device and predicts the current consumption of the audio device (for example, see Japanese Patent Application Publication No. 2016-225913). The audio device compares the predicted current consumption with a predetermined target current, and when the predicted current consumption is over the target current, the device controls the current such that the current consumption will not exceed the target current.

SUMMARY

When an audio device feeds electric power to an external device, the audio device may not be able to supply sufficient electric power to an amplifier of the device itself, which may result in a reduction in sound quality.

An object of the present disclosure is to provide an audio device which can raise the volume of sound without causing a reduction in sound quality even while feeding electric power to an external device.

An audio device according to an embodiment of the present disclosure includes: an audio signal input section that receives an audio signal: a signal processor that performs signal processing on the audio signal: an amplifier that amplifies the audio signal; an audio signal output section that outputs the amplified audio signal: a feeder that feeds electric power to an external device: a feed detector that detects a state of feeding of the electric power by the feeder: and a controller that causes the signal processor to perform level limiting processing to limit a level of the audio signal in a case where the feed detector detects that the feeder is feeding the electric power to the external device.

The audio device according to the embodiment of the present disclosure can raise the volume of sound without causing a reduction in sound quality even while feeding electric power to the external device.

DETAILED DESCRIPTION

Figure 1:
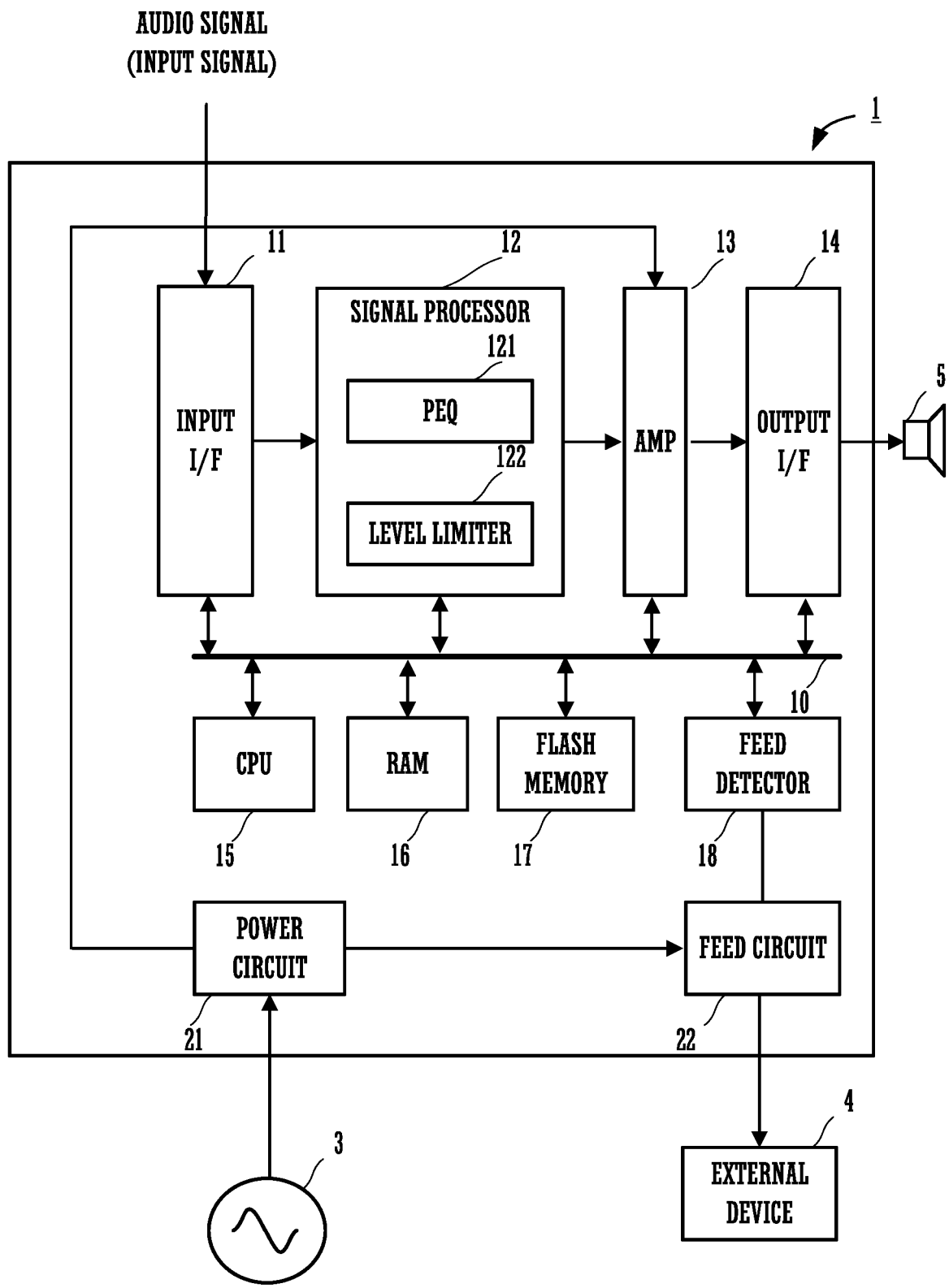
FIG. 1 is a configuration diagram showing the main components of an audio device.
Figure 2:
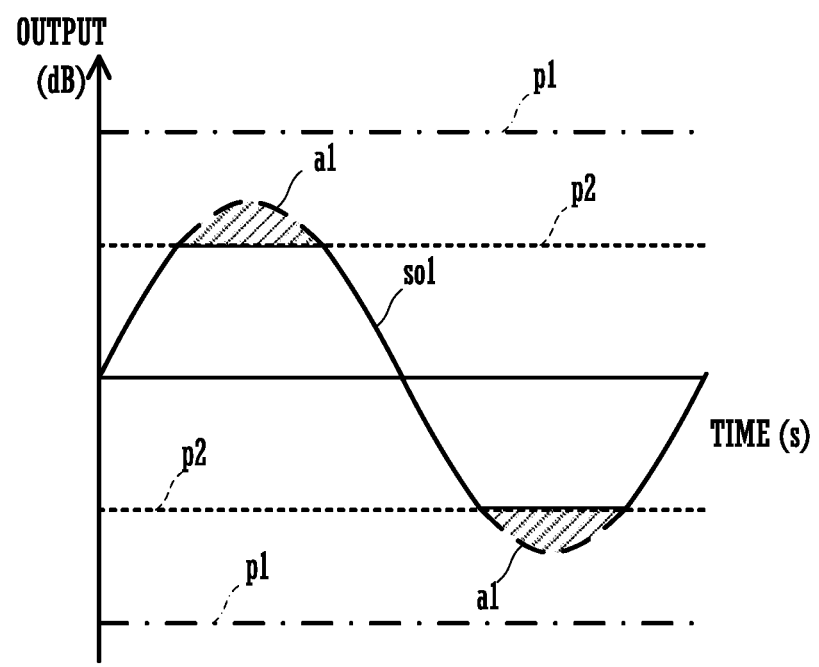
FIG. 2 is a diagram showing an example of an audio signal outputted from a conventional audio device.
Figure 3:
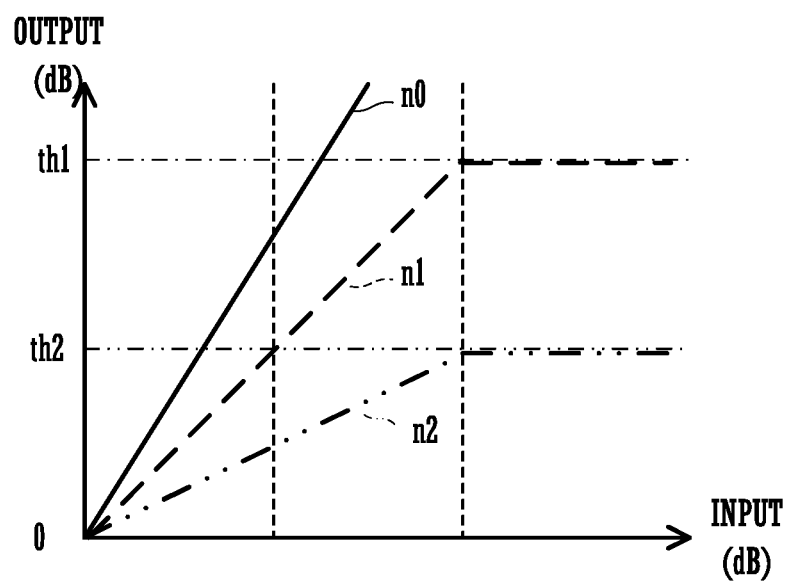
FIG. 3 is a diagram showing an exemplary level limiting function.
Figure 4:
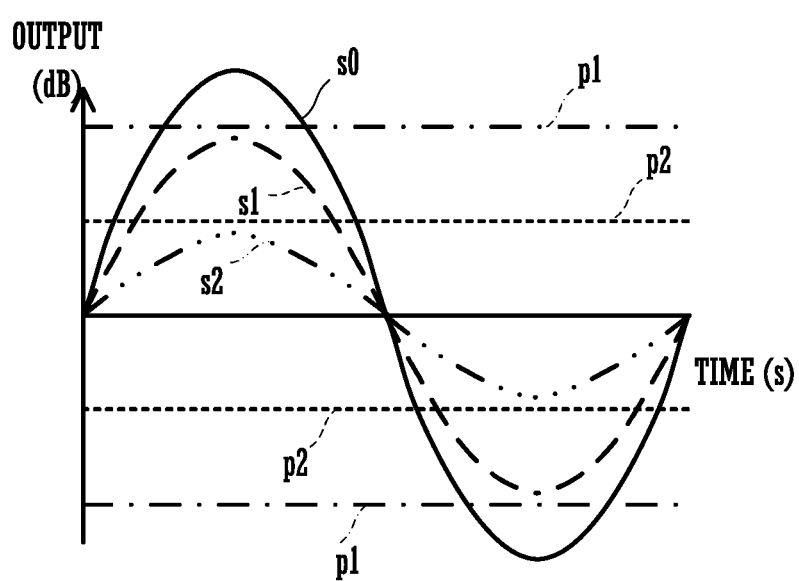
FIG. 4 is a diagram showing an example of an audio signal after being subjected to level limiting processing.

With reference to the drawings, an audio device 1 will hereinafter be described. FIG. 1 is a configuration diagram showing the main components of the audio device 1. FIG. 2 is a diagram showing an example of an audio signal outputted from a conventional audio device. FIG. 3 is a diagram showing an exemplary level limiting function. FIG. 4 is a diagram showing an example of an audio signal after being subjected to level limiting processing.

The audio device 1 is, for example, a personal computer, a set-top box, an audio receiver, a powered speaker, or the like. The audio device 1 acquires an audio signal, for example, from an external reproduction device, a network, a storage device, or the like. The audio device 1 may acquire an audio signal from a microphone or the like. In the present embodiment, unless otherwise noted, an audio signal means a digital audio signal.

The audio device 1 according to the present embodiment feeds electric power to an external device 4. As shown in FIG. 1, the audio device 1 includes a feed circuit 22. In this example, the external device 4 includes a secondary battery. The feed circuit 22 is, for example, a non-contact feed circuit. In other words, the feed circuit 22 feeds electric power to the external device 4 wirelessly. For example, the user can charge the external device 4 only by bringing the external device 4 close to the feed circuit 22.

The electric power fed to the external device 4 by the feed circuit 22 changes, for example, depending on the amount of charge in the secondary battery (remaining battery level) of the external device 4. For example, when the amount of charge in the external device 4 is small, the electric power fed to the external device 4 becomes large. Then, the charging time for the external device 4 is shortened. When the amount of charge in the external device 4 is large, the electric power fed to the external device 4 becomes small.

As shown in FIG. 1, the audio device 1 includes an input I/F (interface) 11, a signal processor 12, an amplifier (which will hereinafter be referred to as an AMP) 13, an output I/F 14, a CPU 15, a RAM 16, a flash memory 17, a feed detector 18, a power circuit 21, and a feed circuit 22.

A bus 10 connects the input I/F 11, the signal processor 12, the AMP 13, the output I/F 14, the CPU 15, the RAM 16, the flash memory 17 and the feed detector 18 with one another.

Electric power is supplied to the power circuit 21 from an external power source (for example, a commercial power source) 3. The power circuit 21, for example, includes an AC/DC converter and the like. The power circuit 21 converts alternating-current power into direct-current power and adjusts the direct-current power to a power level required by the audio device 1. The power circuit 21 uses some part of the adjusted power for the feed circuit 22. The power circuit 21 uses some other part of the power to drive the AMP 13.

The CPU 15 overall controls the audio device 1. The CPU 15 reads out a predetermined program stored in the flash memory 17 to the RAM 16. Then, the CPU 15 performs various operations. The CPU 15 in the present embodiment is an example of a controller of the present disclosure.

The CPU 15 causes the signal processor 12 to perform level limiting processing. The level limiting processing is a process to limit the level of an audio signal. The level limiting processing will be described later.

The feed detector 18 detects the state of feeding. In the present embodiment, the state of feeding means the electric power (level or value of the electric power) fed to the external device 4. The feed detector 18 detects the level of the electric power fed to the external device 4. In the present embodiment, the voltage fed to the external device 4 is constant, and the feed detector 18 monitors the current value and thereby detects the electric power level. The feed detector 18, for example, detects the current flowing in the feed circuit 22 and the voltage applied to the external device 4. Then, from the current and the voltage, the feed detector 18 calculates the value of the electric power fed to the external device 4.

The input I/F 11 includes an interface such as HDMI (registered trade name) or the like. The input I/F 11 receives an audio signal (input signal) and outputs the signal to the signal processor 12.

The signal processor 12 is, for example, a DSP. The signal processor 12 has a function as a PEQ (parametric equalizer) 121 and a function as a level limiter 122. Accordingly, the signal processor 12 applies PEQ processing and level limiting processing to the audio signal inputted thereto.

The PEQ 121 constructs an EQ curve based on parameters, such as a gain and a Q value, that are set for each of a plurality of frequency regions, such as a low-frequency region, an intermediate-frequency region, and a high-frequency region, into which the audio signal is divided as predetermined. The PEQ 121 processes the audio signal according to the EQ curve. The PEQ 121 may construct an EQ curve, for example, using parameters inputted from the user. Alternatively, the PEQ 121 may construct an EQ curve by reading out parameters that are already stored in a memory, for example, in the flash memory 17.

The level limiter 122 performs level limiting processing to limit the level of the audio signal. In the present embodiment, the function of the level limiter 122 includes a limiting function. The limiting function means a function to perform limiting processing. The limiting processing is to control the audio signal such that the level of the audio signal will not exceed a predetermined threshold (limit value). More specifically, the level limiter 122 limits the level of the audio signal, for example, based on the compression ratio set by the CPU 15 or the input value on which compression becomes applicable.

In a conventional audio device, depending on the limit value in the level limiting processing, there are some cases in which a reduction in sound quality is caused. If the level of an audio signal outputted from the signal processor is so high as to require a higher level of power than the maximum power deliverable to the AMP for reproduction of the audio signal, as shown in FIG. 2, the part a1 over the value p2 is clipped from the signal so1. Accordingly, in such a conventional audio device, when the limit value used in level limiting processing is high, the level of the electric power supplied to the AMP may become so small as to cause a reduction in sound quality, such as clipping noise and the like.

In the present embodiment, therefore, the CPU 15 can set two different limit values depending on the electric power level detected by the feed detector 18. The CPU 15 recognizes whether the audio device 1 is in a first state where the electric power level detected by the feed detector 18 is lower than a threshold (for example, 5 W) or in a second state where the electric power level detected by the feed detector 18 is equal to or greater than the threshold. In the first state, the CPU 15 performs a first mode for low level limiting processing. In the second state, the CPU 15 performs a second mode for highlevel limiting processing.

As shown in FIG. 3, the CPU 15 sets a limit value th1 or th2 on an output driving from an input. In the first state where the electric power level detected by the feed detector 18 is low; the CPU 15, for example, sets 20 dB as the limit value th1. In this case, the level limiter 122 controls the audio signal such that the output value n1 will not exceed the limit value th1. In the second state where the electric power level detected by the feed detector 18 is high, the CPU 15, for example, sets 10 dB as the limit value th2. In this case, the level limiter 122 controls the audio signal such that the output value n2 will not exceed the limit value th2.

In FIG. 3, the output value no indicates an audio signal that is not subjected to any level limiting processing.

When the CPU 15 performs the first mode, the signal processor 12 outputs an audio signal s1 as shown in FIG. 4. When the CPU 15 carries out the second mode, the signal processor 12 outputs au audio signal s2 as shown in FIG. 4. Since the limit value th1 set in the first mode is greater than the limit value th2 set in the second mode, the amplitude of the audio signal s1 after being subjected to the first mode of level limiting processing is greater than the amplitude of the audio signal s2 after being subjected to the second mode of level limiting processing.

The audio signal so indicates an audio signal that is not subjected to any level limiting processing.

The AMP 13 amplifies the audio signal outputted from the signal processor 12 to drive the speaker 5. The AMP 13 outputs the amplified audio signal to the output I/F 14.

The maximum electric power deliverable to the AMP varies depending on the level of the electric power fed to the external device. A conventional audio device has a problem that the volume of the audio signal outputted therefrom becomes low even when the audio device is not feeding electric power to an external device. The electric power level p1 in FIG. 4 is the maximum electric power deliverable to the AMP when the audio device is not feeding electric power to an external device. The electric power level p2 is the maximum electric power deliverable to the AMP when the audio device is feeding electric power to an external device. Thus, the higher the level of the electric power fed from the audio device 1 to an external device is, the lower the maximum electric power deliverable to the AMP becomes.

Therefore, the audio device 1 according to the present embodiment changes the level of the audio signal outputted from the signal processor 12 depending on the electric power level detected by the feed detector 18. For example, the level limiter 122 limits the level of the audio signal. This permits the AMP 13 to amplify the audio signal up to the maximum deliverable electric power, which depends on the electric power level detected by the feed detector 18. In other words, the AMP 13 can amplify the audio signal depending on the level of the electric power fed to the external device 4.

The output I/F 14 has an interface such as, for example, HDMI (registered trade name). The output I/F 14 outputs an audio signal amplified by the AMP 13 to the speaker 5 connected to the interface.

Figure 5:
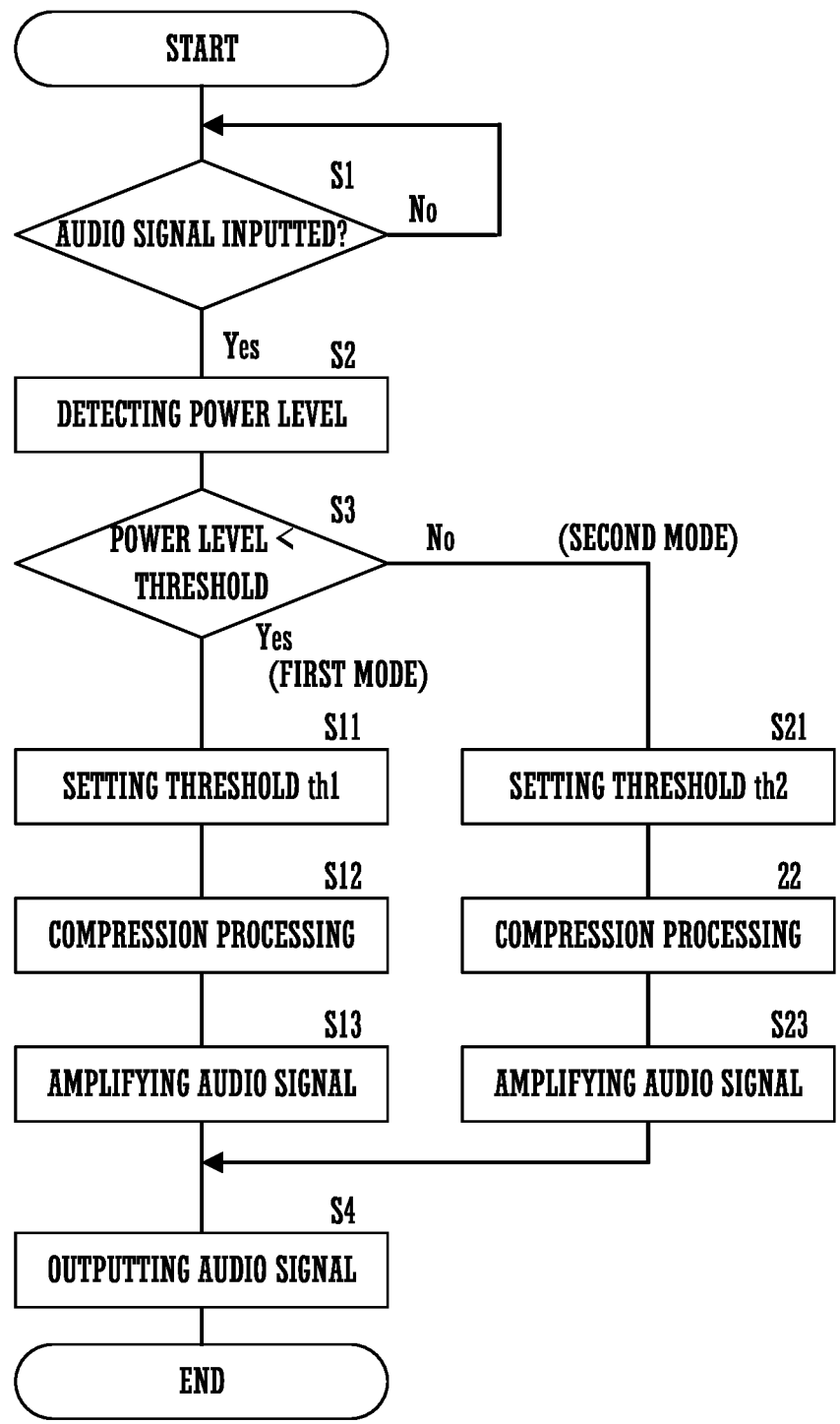
FIG. 5 is a flowchart showing an exemplary process carried out by the audio device.

The main operation of the audio device 1 will hereinafter be described with reference to FIG. 5. FIG. 5 is a flowchart showing an exemplary process carried out by the audio device 1.

When the audio device 1 receives an audio signal (Yes at S1), the audio device 1 detects the level of the electric power fed from the feed circuit 22 to the external device 4 (S2). When the detected electric power level is lower than the threshold (first state) (Yes at S3), the audio device 1 performs the first mode. In this case, the audio device 1 sets the limit value th1 (S11). The audio device 1 performs level limiting processing of the audio signal such that the level of the audio signal will not exceed the limit value th1 (S12). The audio device 1 amplifies the audio signal (S13). The audio device 1 outputs the amplified audio signal to the speaker 5 (S4).

When the detected electric power level is equal to or higher than the threshold (second state) (No at S3), the audio device 1 performs the second mode. In this case, the audio device 1 sets the limit value th2 (S21). The audio device 1 performs level limiting processing of the audio signal such that the level of the audio signal will not exceed the limit value th2 (S22). The audio device 1 amplifies the audio signal (S23). The audio device 1 outputs the amplified audio signal to the speaker 5 (S4).

The process carried out by the audio device 1 is not limited to the one described above. For example, in the process carried out by the audio device 1, step S2 and step S3 are interchangeable.

Thus, even when the level of the audio signal outputted from the signal processor 12 is high, the audio device 1 can amplify the audio signal in the AMP 13 while maintaining the waveform of the audio signal. Accordingly, the user can hear good sound with no clipping noise.

When the electric power fed to the external device becomes great, the level limiter 122 limits the level of the audio signal more severely, and thereby, even when the maximum electric power deliverable to the AMP 13 becomes low; the audio device 1 can amplify the audio signal while maintaining the wavelength of the audio signal. Therefore, the audio device 1 can raise the volume of sound without degrading the sound quality even while the audio device 1 is feeding electric power to the external device 4. In other words, when the maximum electric power deliverable to the AMP 13 is high, the audio device 1 reproduces a high-level audio signal without performing strong compression of the audio signal. Accordingly, the user can hear sound with a wide dynamic range.

The feed detector 18 may detect the state of feeding by detecting whether the feeding is on or off. Thus, the first state includes a state in which the feed circuit 22 is not feeding electric power to the external device 4. In other words, the first state includes a state where the power fed from the feed circuit 22 is zero. When the feed detector 18 detects that the feeding is on, the CPU 15 performs the second mode. When the feed detector 18 does not detect that feeding is performed (when the feed detector 18 detects that the feeding is off), the CPU 15 performs the first mode.

The feed detector 18 may detect the power consumption of the audio device 1 itself (excluding the feed circuit 22). The feed detector 18 may detect the electric power consumed by the AMP 13, for example. Then, for example, the feed detector 18 may subtract the power consumption of the AMP 13 from the total electric power converted (generated) by the power circuit 21. The feed detector 18 considers the thus calculated power as the electric power that is fed to the external device 4 by the feed circuit 22. In this case, when the calculated power is small, the CPU 15 performs the first mode. When the calculated power is large, the CPU 15 performs the second mode.

The first mode includes to set a zero limitation (no limitation) for the level limiting processing. In other words, when the maximum electric power deliverable to the AMP 13 is so high that the signal processor 12 does not need to limit the level of the audio signal, the CPU 15 may suspend the function as the level limiter 122.

The signal processor 12 may perform the level limiting processing of a low-frequency region of the audio signal that is among a plurality of frequency regions into which the audio signal is divided as predetermined. For example, the signal processor 12 divides the audio signal into a low-frequency region (a frequency region of 100 Hz or lower), an intermediate-frequency region (a frequency region of 100 Hz to 1 kHz) and a high-frequency region (a frequency region of 1 kHz or higher). The signal processor 12 performs stronger limiting processing of the low-frequency region of the audio signal. Then, even when the audio device 1 is feeding electric power to the external device 4, the effect on the sound quality is reduced. The audio signal in a low-frequency region has a long wavelength and accordingly has a great effect on the power consumption. Thus, even though performing level limiting processing of only a frequency region of the audio signal, the audio device 1 can suppress degradation of sound quality, such as clipping noise, and raise the volume of sound because the frequency region subjected to the level limiting processing has a great effect on the power consumption.

The feed circuit 22 is not limited to a wireless feed circuit. For example, the feed circuit 22 may have a charging function using wire-line connection such as USB connection or the like. In this case, the audio device 1 feeds electric power to the external device 4 by wire.

The audio device 1 may have a battery (primary or secondary battery). The feed detector 18 detects the electric power fed to the external device 4 and the remaining battery level. The CPU 15 may set the limit value depending on the level of the electric power fed to the external device 4 and the remaining battery level. For example, when the remaining battery level is low; the CPU 15 may set a lower limit value.

The function as the level limiter 122 (level limiting processing) is not limited to a limiting function (limiting processing). The function as the level limiter 122 may be a compressing function.

Modification 1

Figure 6:
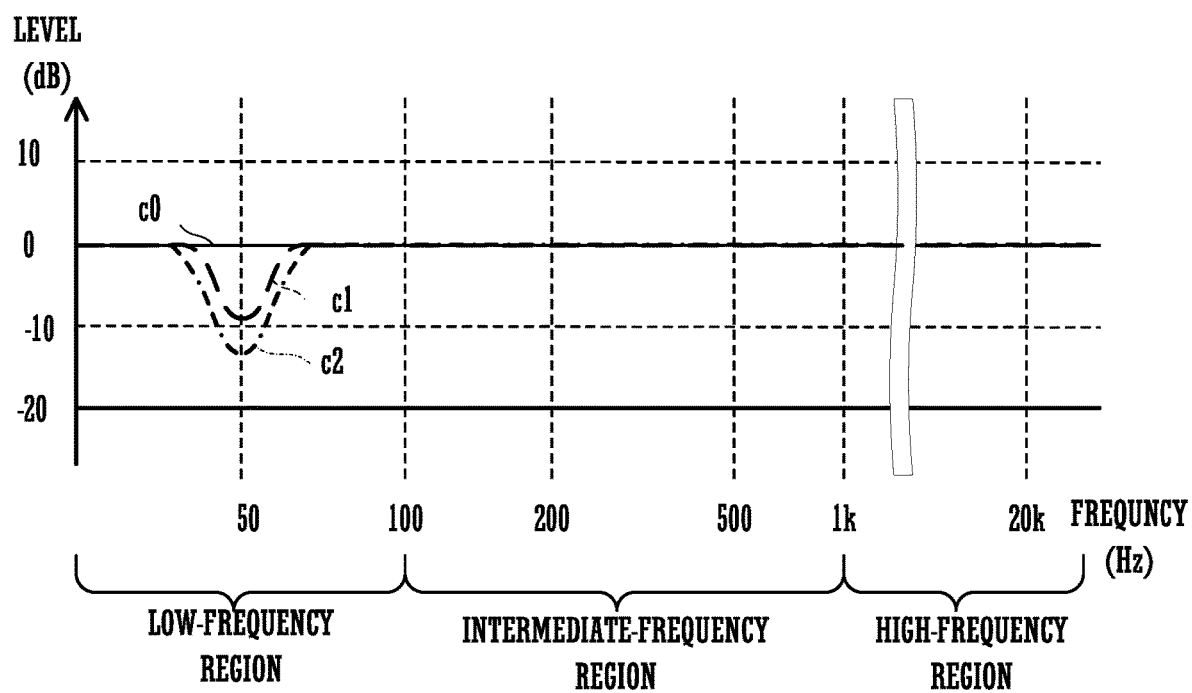
FIG. 6 is a diagram showing exemplary EQ curves according to Modification 1.

Modification 1 of the audio device 1 will hereinafter be described with reference to FIG. 6. FIG. 6 is a diagram showing exemplary EQ curves c1 and c2 according to Modification 1. The CPU 15 causes the PEQ 121 to perform level limiting processing. The same elements as in the above-described first embodiment are provided with the same reference symbols, and the descriptions thereof are omitted.

The EQ curves c1 and c2 are curves showing the frequency characteristics of the equalizer. The CPU 15 sets a parameter, for example, a gain for constitution of the EQ curve c1. In this example, the PEQ 121 performs level limiting processing of a low-frequency region of the audio signal that is among a plurality of frequency regions into which the audio signal is divided as predetermined. In this example, the low-frequency region is a frequency region of 100 Hz or lower. The intermediate-frequency region is a frequency region of 100 Hz to 1 kHz. The high-frequency region is a frequency region of 1 kHz or higher.

In Modification 1, when the level of the electric power fed to the external device 4 is low; the PEQ 121 increases the gain (decreases the amount of cutting) (see EQ curve c1 in FIG. 6). When the level of the electric power fed to the external device 4 is high, the PEQ 121 decreases the gain (increases the amount of cutting) (see EQ curve c2 in FIG. 6). By decreasing the gain of the PEQ 121, the audio device 1 can amplify the audio signal while maintaining the waveform of the audio signal even when the maximum electric power deliverable to the AMP 13 is low. Thus, the audio device 1 can suppress degradation of sound quality and raise the volume of sound even while feeding electric power to the external device 4.

Modification 2

Figure 7:
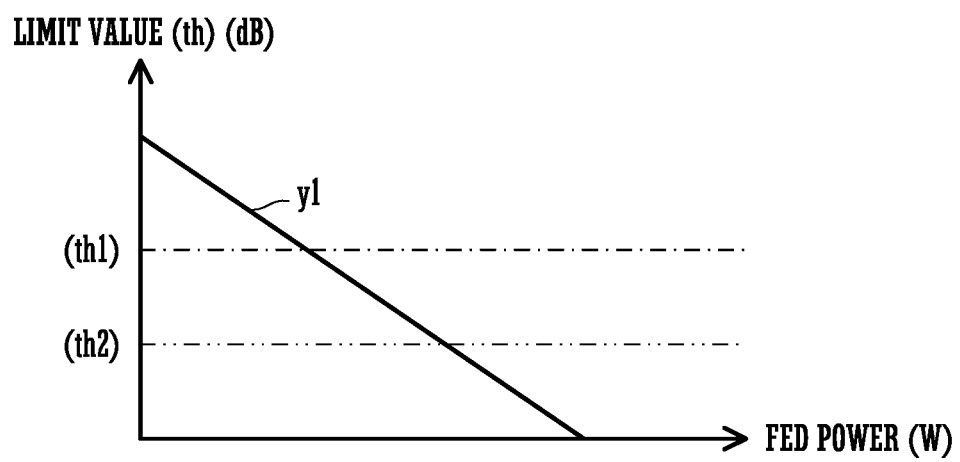
FIG. 7 is a diagram showing a limiter curve for a maximum electric power deliverable to an amplifier of an audio device according to Modification 2.

Modification 2 of the audio device 1 will hereinafter be described with reference to FIG. 7. FIG. 7 is a diagram showing a limiter curve y1 according to Modification 2 for the maximum electric power deliverable to the AMP 13. The same elements as in the above-described first embodiment are provided with the same reference symbols, and the descriptions thereof are omitted. The symbols th1 and th2 in FIG. 7 denote desired limit values.

In Modification 2, the level limiter 122 of the audio device 1 changes the maximum electric power deliverable to the AMP 13 depending on the level of the electric power fed to the external device 4. For example, as shown in FIG. 7, the level limiter 122 limits the level of the audio signal based on the limiter curve $y1=f(P)$ set by the CPU 15. Here, P denotes the electric power (level or value of the electric power) fed to the external device 4.

The higher the level of the electric power fed to the external device 4 is, the smaller value the CPU 15 sets as the limit value th. In this case, the CPU 15 sets the maximum electric power based on the limiter curve y1 (function) shown in a table stored in the flash memory 17 or shown in FIG. 7, depending on the level of the electric power fed to the external device 4. The level limiter 122 performs audio signal processing such that the level of the audio signal will not exceed the limit value set by the CPU 15.

Thus, as the level of the electric power fed to the external device 4 becomes higher, the level limiter 122 limits the level of the audio signal more severely. Thereby, the audio device 1 of Modification 2 can raise the volume of sound without degrading the sound quality even when the maximum electric power deliverable to the AMP 13 is low.

It should be understood that the present embodiment has been described as an example and that the description is not limiting. The scope of the present disclosure is not limited to the embodiment and modifications above and is determined by the claims. Further, the scope of the disclosure shall be deemed to include equivalents of the scope of the claims.

For example, in the present embodiment, as an example of level limiting processing, using the function as a level limiter (or a limiter) 122 and the function as a PEQ 121 has been described. However, the level limiting processing is not limited to this. The level limiting processing, for example, may be high-pass filtering processing. When the audio device 1 performs delay, reverb, or the like during signal processing, the level limiting processing includes reducing the length of the delay, reverb, or the like. The level limiting processing is performing at least one of these kinds of signal processing.

What is claimed is:
1. An audio device comprising:
an audio signal input section that receives an audio signal;
a signal processor that performs signal processing on the audio signal;
an amplifier that amplifies the audio signal;
an audio signal output section that outputs the amplified audio signal;
a feeder that feeds electric power to a secondary battery that is not part of the audio device;
a feed detector that detects a state of feeding of the electric power by the feeder; and
a controller that causes the signal processor to perform level limiting processing to limit a level of the audio signal in a case where the feed detector detects that the feeder is feeding the electric power to the secondary battery.

2. The audio device according to claim 1, wherein:
the feed detector detects a fed power level as the state of feeding; and
the controller (i) causes the signal processor to perform a first mode for level limitation in the level limiting processing in a case where the feed detector detects a first state in which the fed power level detected by the feed detector is smaller than a threshold and (ii) causes the signal processor to perform a second mode for level limitation in the level limiting processing different from the first mode in a case where the feed detector detects a second state in which the fed power level detected by the feed detector is equal to or greater than the threshold.

3. The audio device according to claim 2, wherein the first state includes a state where the fed power level detected by the feed detector is zero.

4. The audio device according to claim 2, wherein the first mode includes a case of not limiting the level of the audio signal in the level limiting processing.

5. The audio device according to claim 1, wherein the controller dynamically changes a value at which the level of the audio signal is to be limited in the level limiting processing depending on the state of the feeding of the electric power detected by the feed detector.

6. The audio device according to claim 1, wherein the feed detector detects the state of the feeding of the electric power by calculating a level of the electric power fed to the secondary battery.

7. The audio device according to claim 1, wherein the level limiting processing includes limiting processing to limit the level of the audio signal to a predetermined value or less.

8. The audio device according to claim 1, wherein the signal processor performs the level limiting processing on a low-frequency region among a plurality of frequency regions into which the audio signal is divided.

9. The audio device according to claim 1, wherein the feeder feeds the electric power to the secondary battery wirelessly.

10. The audio device according to claim 1, wherein the controller causes the signal processor to perform the level limiting processing depending on a remaining battery level.

11. An audio signal processing method comprising:
receiving an audio signal;
performing, by a signal processor, signal processing on the audio signal;
amplifying the audio signal;
outputting the amplified audio signal;
feeding, by a feeder, electric power to a secondary battery that is not part of the audio device;

detecting, by a feed detector, a state of feeding of the electric power by the feeder; and causing the signal processor to perform level limiting processing to limit a level of the audio signal in a case where the feed detector detects that the feeder is feeding the electric power to the secondary battery.

12. The audio signal processing method according to claim 11, wherein:

a fed power level is detected by the feed detector as the state of feeding; and the level limiting processing performed by the signal processor includes (i) a first mode for level limitation in a case where the feed detector detects a first state in which the fed power level detected by the feed detector is smaller than a threshold and a second mode for level limitation different from the first mode in a case where the feed detector detects a second state in which the fed power level detected by the feed detector is equal to or greater than the threshold.

13. The audio signal processing method according to claim 12, wherein the first state includes a state where the fed power level detected by the feed detector is zero.

14. The audio signal processing method according to claim 12, wherein the first mode includes a case of not limiting the level of the audio signal in the level limiting processing.

15. The audio signal processing method according to claim 11, wherein a value at which the level of the audio signal is to be limited, in the level limiting processing, is dynamically changed depending on the state of the feeding of the electric power detected by the feed detector.

16. The audio signal processing method according to claim 11, wherein the feed detector detects the state of the feeding of the electric power by calculating a level of the electric power fed to the secondary battery.

17. The audio signal processing method according to claim 11, wherein the level limiting processing includes limiting processing to limit the level of the audio signal to a predetermined value or less.

18. The audio signal processing according to claim 11, wherein the signal processor performs the level limiting processing on a low-frequency region among a plurality of regions into which the audio signal is divided.

19. The audio signal processing according to claim 11, wherein the feeder feeds the electric power to the secondary battery wirelessly.

20. The audio signal processing method according to claim 11, wherein the level limiting processing is performed depending on a remaining battery level.

\* \* \* \* \*